United States Patent [19]

Chen et al.

[11] Patent Number: 5,286,675
[45] Date of Patent: Feb. 15, 1994

[54] BLANKET TUNGSTEN ETCHBACK PROCESS USING DISPOSABLE SPIN-ON-GLASS

[75] Inventors: Kuang-Chao Chen; Shaw-Tzeng Hsia, both of Taipei, Taiwan

[73] Assignee: Industrial Technology Research Institute, Hsinchu, Taiwan

[21] Appl. No.: 46,780

[22] Filed: Apr. 14, 1993

[51] Int. Cl.$^5$ .............................................. H01L 21/44
[52] U.S. Cl. ...................... 437/195; 437/180; 437/192; 437/193; 437/203; 437/231
[58] Field of Search ............... 437/195, 192, 193, 203, 437/231, 194, 180, 182, 183

[56] References Cited

U.S. PATENT DOCUMENTS

| | | | |
|---|---|---|---|
| 4,833,519 | 5/1989 | Kawano et al. | 437/195 |
| 4,879,257 | 11/1989 | Patrick | 437/195 |
| 4,952,528 | 8/1990 | Abe et al. | 437/195 |
| 4,960,732 | 10/1990 | Dixit et al. | 437/195 |
| 5,006,485 | 4/1991 | Villalon | 437/195 |
| 5,091,340 | 2/1992 | Mizushima | 437/195 |
| 5,164,330 | 11/1992 | Davis et al. | 437/192 |

OTHER PUBLICATIONS

J. E. J. Schmitz, *Chemical Vapor Deposition of Tungsten and Tungsten Silicides,* Noyes Publications, Park Ridge, N.J. 1992 pp. 43-50.

*Primary Examiner*—Brian E. Hearn
*Assistant Examiner*—Kevin M. Picardat
*Attorney, Agent, or Firm*—George O. Saile

[57] ABSTRACT

A new method of completing a tungsten contact is described. An insulator layer is formed over device structures in and on a semiconductor substrate. The insulator layer is flowed to planarize the layer. The insulator layer is covered with a spin-on-glass layer which is baked and cured. Contact openings are formed through the insulator and spin-on-glass layers to the device structures and to the substrate. A nucleation layer is formed over the spin-on-glass layer and within the contact openings. A layer of tungsten is deposited over the nucleation layer. The tungsten layer is etched back, thereby leaving the tungsten layer within the contact openings and leaving some of the tungsten layer as residue overlying the spin-on-glass layer. The spin-on-glass layer is removed, thereby removing any tungsten layer residue overlying the spin-on-glass layer. The contacts are completed by an aluminum metalization.

25 Claims, 5 Drawing Sheets

BLANKET TUNGSTEN ETCHBACK PROCESS USING DISPOSABLE SPIN-ON-GLASS

BACKGROUND OF THE INVENTION (1) Field of the Invention

The invention relates to a method of completing a tungsten contact in an integrated circuit device, and more particularly, to a method of completing a tungsten contact while maintaining underlayer planarity.

(2) Description of the Prior Art

Blanket etchback of tungsten is known. In his book, *Chemical Vapor Deposition of Tungsten and Tungsten Silicides* (by John E. J. Schmidt, Noyes Publications, Park Ridge, NJ, c. 1992, pp. 43–50), Schmidt describes the etchback of blanket tungsten either with or without a sacrificial layer. The problem of tungsten residue is not addressed.

Referring to FIG. 1, there is shown a portion of a partially completed integrated circuit in which there is a silicon substrate 10. Also shown are dielectric layers 12 and 16 and a polysilicon layer 14. Contact or via opening 17 is shown to a source/drain region 18. A shorter contact or via opening 19 contacts polysilicon layer 14. A layer of tungsten 20 is blanket deposited over all. A barrier or adhesion layer such as titanium nitride may be used under the tungsten layer, but is not illustrated.

FIG. 2 shows the same portion of the integrated circuit after tungsten etchback. There are four problem areas. In area 1 where the slope of the indentation is 40% or more, a residue of tungsten layer 20 remains after etching. In area 2, where the slope is 30% or more, some tungsten residue remains. In area 3, the contact is about 1 micrometer in height. There is a dimple in the tungsten plug. In area 4, where the contact is less than about 0.6 micrometers in height, the plug may have a dimple which goes all the way to the underlying layer. If the tungsten is etched enough to remove the residue in areas 1 and 2, the entire plug is area 4 will be etched away and damage may occur to the underlying layer 14. If tungsten residue exists after the tungsten etchback, leakage will occur from the residue into overlying layers. Overetching to remove the residue results in the loss of the tungsten plug in short via holes. Another drawback of the conventional process is that surface roughness of the tungsten is transferred to the underlayer silicon oxide layer when the tungsten is etched back. Because of this, there is a critical requirement for underlayer planarity necessitating a higher flow temperature for the insulator flow process.

U.S. Pat. No. 5,164,330 to Davis et al describes a method of etching a tungsten layer using nitrogen trifluorid ($NF_3$) and argon gases to reduce residue buildup.

SUMMARY OF THE INVENTION

A principal object of the present invention is to provide an effective and very manufacturable method of completing a tungsten contact while maintaining underlayer planarity.

Another object of the present invention is to provide a method of completing a tungsten contact in which there is no tungsten residue induced leakage after tungsten etchback.

In accordance with the objects of this invention a new method of completing a tungsten contact is achieved. An insulator layer is formed over device structures in and on a semiconductor substrate. The insulator layer is flowed to planarize the layer. The insulator layer is covered with a spin-on-glass layer which is baked and cured. Contact openings are formed through the insulator and spin-on-glass layers to the device structures and to the substrate. A nucleation layer is formed over the spin-on-glass layer and within the contact openings. A layer of tungsten is deposited over the nucleation layer. The tungsten layer is etched back, thereby leaving the tungsten layer within the contact openings and leaving some of the tungsten layer as residue overlying the spin-on-glass layer. The spin-on-glass layer is removed, thereby removing any tungsten layer residue overlying the spin-on-glass layer. The contacts are completed by an aluminum metalization.

BRIEF DESCRIPTION OF THE DRAWINGS

In the accompanying drawings forming a material part of this description, there is shown.

DESCRIPTION OF THE PREFERRED EMBODIMENTS

Figure 1:
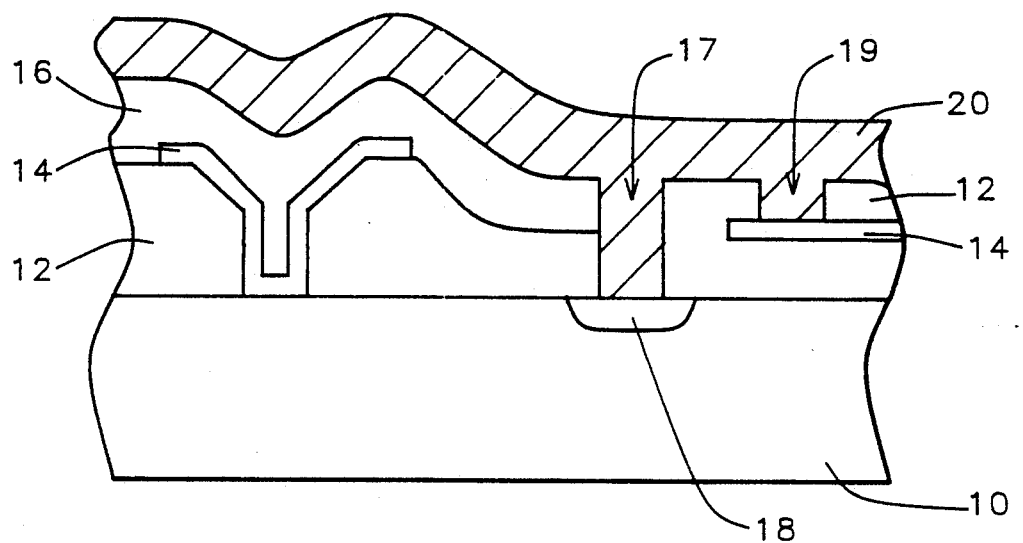
FIGS. 1 and 2 schematically illustrate in cross-sectional representation some drawbacks of the conventional prior art process.
Figure 2:
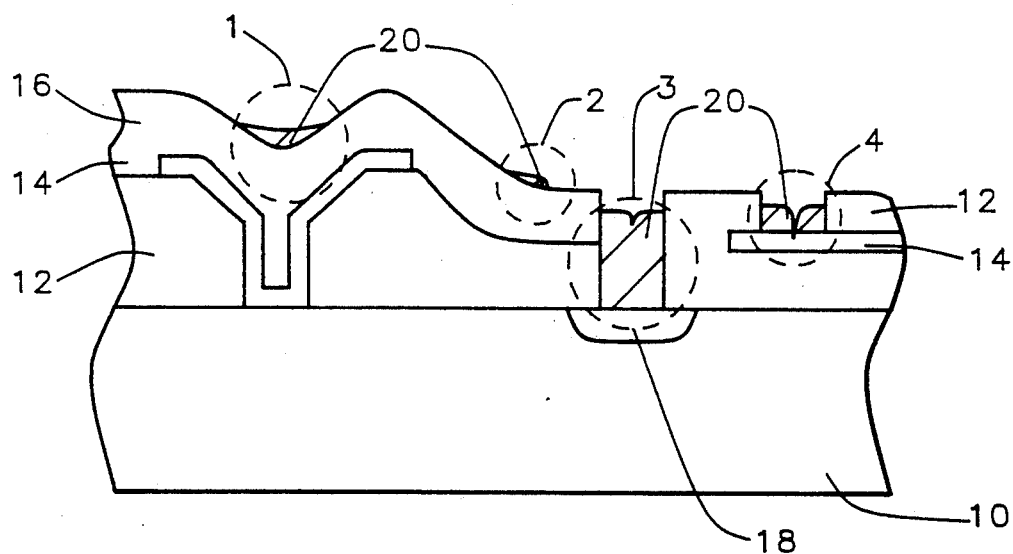
Figure 3:
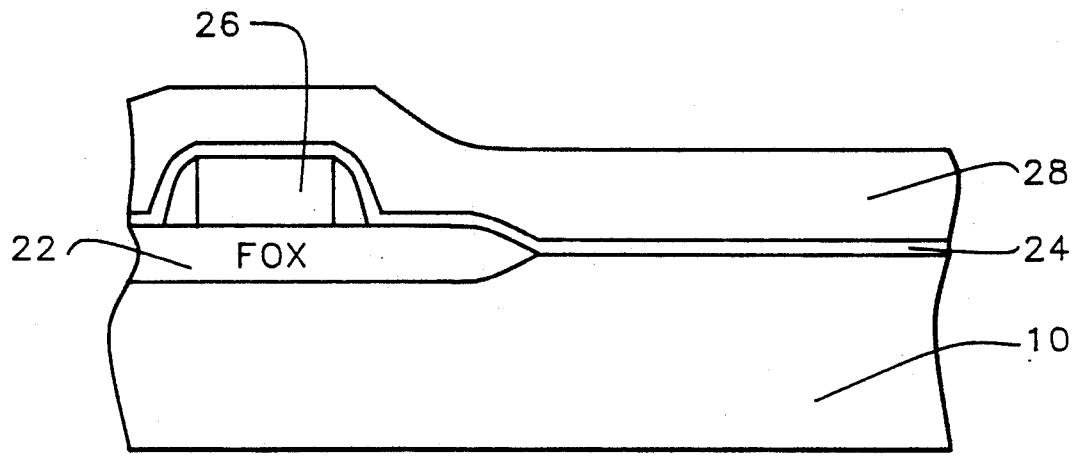
FIGS. 3 through 9 schematically illustrate in cross-sectional representation one preferred embodiment of the present invention.

Referring now more particularly to FIG. 3, the process of the present invention will be described. A portion of a partially completed integrated circuit is illustrated in FIG. 3 consisting of a semiconductor substrate 10, preferably composed of monocrystalline silicon. Field oxide region 22 has been formed in the semiconductor substrate 10. Semiconductor device structures such as gate electrodes, not shown, and interconnection runners 26 are formed as is conventional in the art overlying the gate dielectric, not shown, and the FOX regions 22. A passivation or insulating layer is then formed over the surfaces of the patterns. This layer may be composed of multilayers such as a thin layer of silicon oxide 24 and a much thicker layer of borophosphosilicate glass (BPSG) or phosphosilicate glass 28. The thicknesses of these layers are between about 500 to 2000 Angstroms for the silicon oxide layer and between about 3000 to 6000 Angstroms for the glasseous layer. These layers are typically deposited by low pressure chemical vapor deposition (LPCVD), atmospheric pressure chemical vapor deposition (APCVD), or plasma enhanced chemical vapor deposition (PECVD). The glasseous layer 28 is flowed at 800° to 900° C. in a nitrogen, argon, or steam ambient for 1 to 2 hours to planarize the surface of the wafer.

Figure 4:
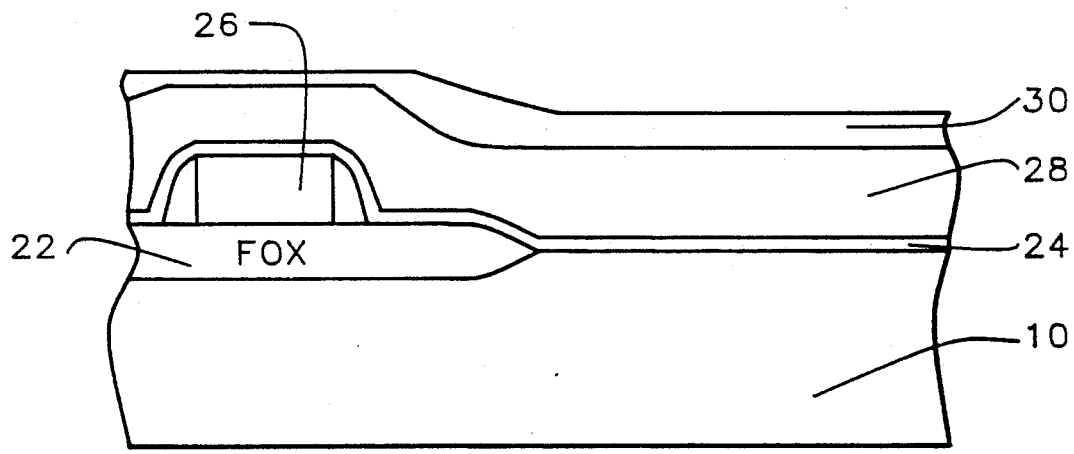

A spin-on-glass material such as siloxane (Allied Signal 110 or 210) is deposited over the glasseous layer 28. The spin-on-glass material suspended in the vehicle or solvent is deposited onto the semiconductor wafer surface and uniformly spread thereover by the action of spinning the wafer, for example, at 3500 revolutions per minute. The spin-on-glass material fills in the indentations and smooths the integrated circuit wafer surface. This spin-on-glass layer 30 is shown in FIG. 4.

Most of the vehicle or solvent is driven off by a low temperature baking step. The wafer is heated to for example 80°-100°-150°-200°-250°-300° C. for a duration of 1 to 2 minutes for each stage. The total thickness of the spin-on-glass material is between about 500 to 3000 Angstroms, and preferably 900 to 1100 Angstroms on the bare wafer, depending upon the particular type of spin-on-glass material, that is siloxane or silicate material that is used. It is critical that the spin-on-glass material can withstand the tungsten chemical vapor deposition temperature in a subsequent process step.

Curing is dependent upon the spin-on-glass material used. If a siloxane is used, as is preferable, curing is preferred. A curing step in a nitrogen or other inert atmosphere densifies as well as cures the spin-on-glass layer to a silicon oxide structure. There is typically a stabilization time of less than about 60 minutes and preferably about 50 minutes, followed by a less than about 30 minutes and preferably 15 minute ramp-up from 370° C. to 425° C. The curing step is preferably at least about 60 minutes.

Figure 5:
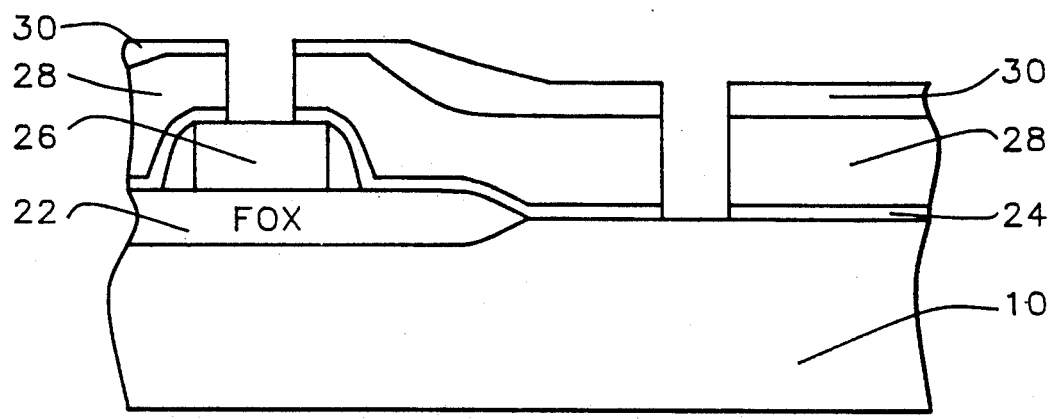

Contact or via openings are formed through the insulating structure to the semiconductor substrate 10 and to device structures such as interconnection runner 26, as shown in FIG. 5. Conventional lithography and etching techniques are used to form this pattern of openings.

Figure 6:
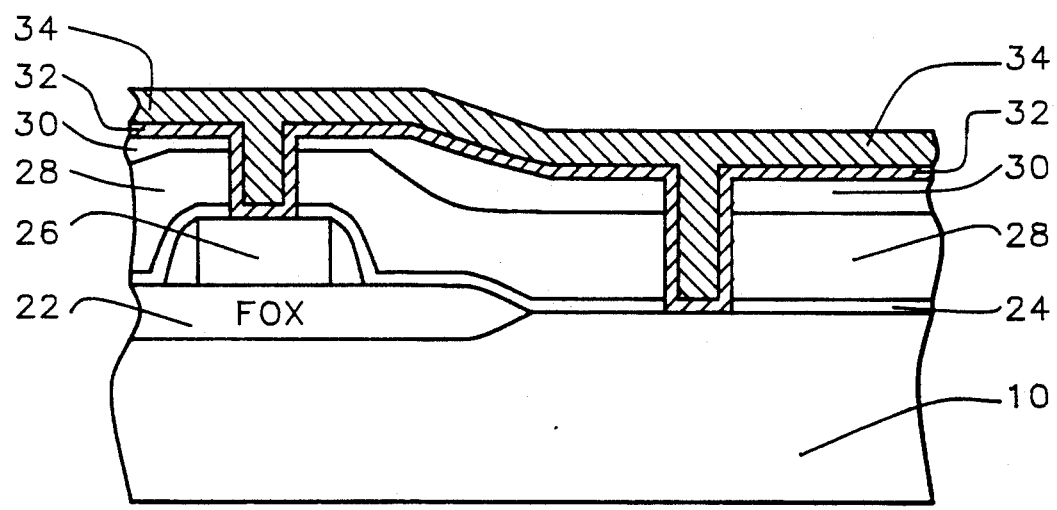

As seen in FIG. 6, a nucleation layer 32 is now deposited over the surface of the structure and within the pattern of via openings. This layer is preferably Ti/TiN, Ti/TiW, Ti/TiWN, Ti/TiN from Ti nitration using $N_2$ or $NH_3$ at 700° C., or TiN only, or the like and is deposited by physical vapor deposition, such as by sputtering, to a thickness of between about 800 to 2000 Angstroms.

A layer of tungsten 34 is now deposited by chemical vapor deposition at a temperature of between about 400° to 500° C. to a thickness of between about 3500 to 5000 Angstroms.

Figure 7:
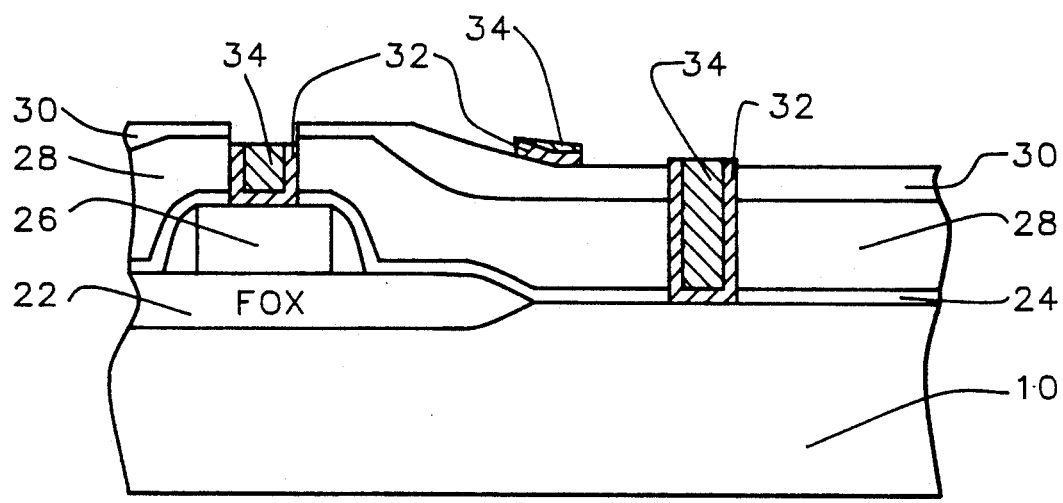

Referring now to FIG. 7, the nucleation layer 32 and the tungsten layer 34 are anisotropically etched back according to the following steps. The first step is a bulk etch timed to etch away 85% of the thickness. The gases $SF_6$, Ar, and He are flowed at 140, 110, and 40 sccm, respectively, under a power of 625 watts. The second step is a first overetch with an endpoint at the nucleation layer 32. The $SF_6$, Ar, and He gases are flowed at 80, 20, and 40 sccm, respectively, under a power of 250 watts. The third step is a second overetch for approximately 60 seconds, based on thickness. The $SF_6$, Ar, and He gases are flowed at 80, 20, and 40 sccm, respectively, under a power of 250 watts, as in the second step. The next two steps etch the nucleation layer 32. The first TiN etch has an etch rate of 2000 to 2500 Angstroms/minute. It is a timed etch based on thickness. $Cl_2$ and Ar gases are both flowed at a rate of 35 sccm under power of 350 watts. The second TiN etch has an etch rate of approximately 600 Angstroms/minute and is also a timed etch based on thickness. The $Cl_2$ and Ar gases are flowed at 5 and 90 sccm, respectively, under power of 450 watts. The selectivity of TiN to tungsten is 1:1.

Some residue of the tungsten and nucleation layers will remain on top of the spin-on-glass layer, but this will not cause a problem, because the residue will be removed when the spin-on-glass layer is removed. There is also some plug loss within the contact or via openings, but this also is not a problem because the loss is mostly within the height of the spin-on-glass layer which will be removed.

Figure 8:
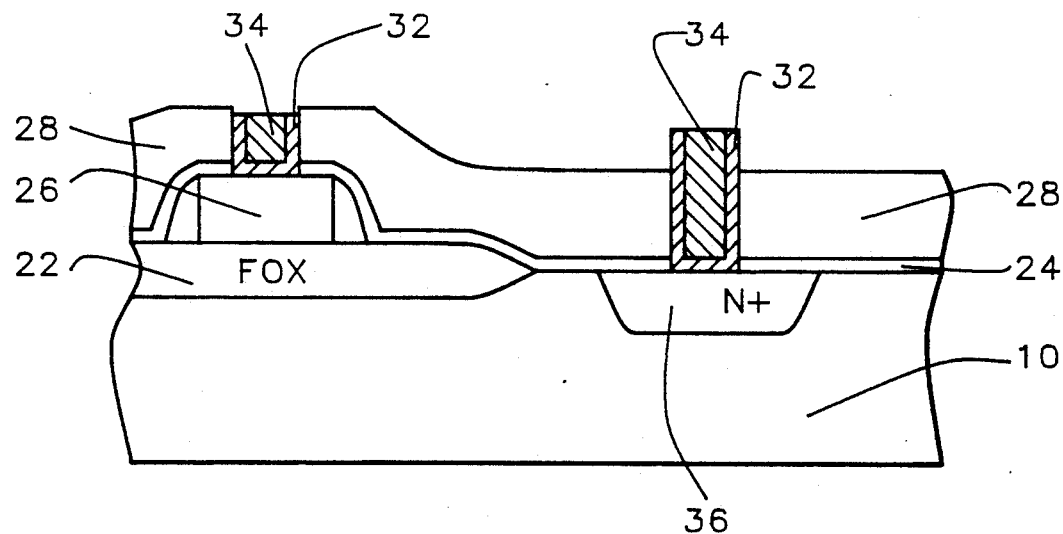

Referring now to FIG. 8, the spin-on-glass layer 30 is removed by buffered hydrofluoric acid. For example, $HF(1):H_2O(200)$ or $HF(1):NH_4F(1):H_2O(200)$ with an etch time of 30 to 120 seconds. The spin-on-glass layer will etch much faster than the phosphosilicate glass and the titanium nitride or the like layers.

Figure 9:
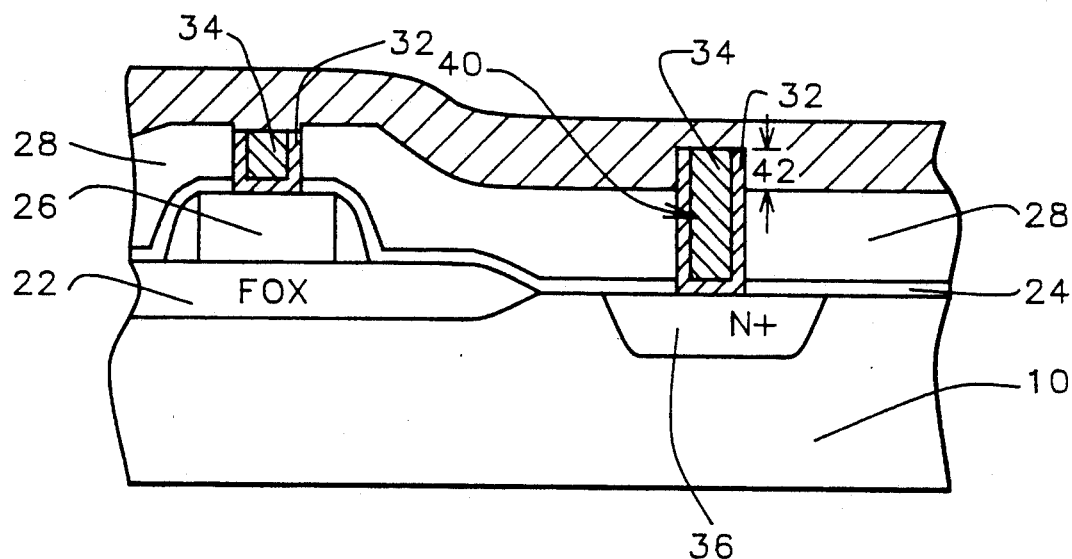

Source/drain region 36 is formed as a N+, P+, N−, or P−region, as is conventional in the art. Metal layer 38, shown in FIG. 9, is deposited over the wafer to complete the contacts. This metal layer can be AlSiOCu, AlCu, or aluminum alloy. The tungsten plug 40 protrudes above the glasseous layer 28 into the aluminum layer 38 for a height 42 of less than about 0.2 micrometers as seen in FIG. 9. It is acceptable to have this tungsten plug because it is necessary to get rid of the residue 34. Tungsten plug 44 is slightly below the surface of glasseous layer 28. This is an acceptable plug level which the next metal layer 38 can electrically connect satisfactorily.

While the invention has been particularly shown and described with reference to the preferred embodiments thereof, it will be understood by those skilled in the art that various changes in form and details may be made without departing from the spirit and scope of the invention.

What is claimed is:

1. The method of completing tungsten contacts in an integrated circuit comprising:

providing semiconductor device structures in and on a semiconductor substrate;

providing at least one patterned conductive layer for contacting the active elements of said device structures;

the surface of said patterned conductive layer structure is irregular with horizontal and vertical components;

depositing and flowing an insulator layer over said irregular structure patterned conductive layer;

covering said insulator with a spin-on-glass layer and baking said spin-on-glass layer;

defining contact openings through said insulator and spin-on-glass layers to said device structures and to said substrate;

depositing a nucleation layer over said spin-on-glass layer and within said contact openings;

depositing a layer of tungsten over said nucleation layer;

etching back said tungsten layer and said nucleation layer thereby leaving said tungsten layer within said contact openings and leaving some of said tungsten layer as residue overlying said spin-on-glass layer;

removing said spin-on-glass layer and thereby removing any said tungsten layer residue overlying said spin-on-glass layer; and depositing a layer of metal to complete said contacts to said device structures and to said silicon substrate.

2. The method of claim 1 wherein said insulator layer is composed of borophosphosilicate glass deposited to a thickness of between about 3000 to 6000 Angstroms and flowed at conditions 800° to 900° C. in nitrogen, Argon, or steam ambient for 1 to 2 hours.

3. The method of claim 1 wherein said spin-on-glass layer has a thickness of between about 500 to 3000 Angstroms and is of siloxane type.

4. The method of claim 1 wherein said spin-on-glass layer has a thickness of between about 500 to 3000 Angstroms and is of silicate type.

5. The method of claim 1 wherein said spin-on-glass layer is baked with conditions 80°-100°-150°-200°-25-

0°-300° C. for a duration of 1 to 2 minutes for each stage.

6. The method of claim 1 wherein said nucleation layer is composed of Ti/TiN and has a thickness of between about 800 to 2000 Angstroms.

7. The method of claim 1 wherein said nucleation layer is composed of Ti/TiW and has a thickness of between about 800 to 2000 Angstroms.

8. The method of claim 1 wherein said nucleation layer is composed of Ti/TiWN and has a thickness of between about 800 to 2000 Angstroms.

9. The method of claim 1 wherein said nucleation layer is composed of TiN and has a thickness of between about 800 to 2000 Angstroms.

10. The method of claim 1 wherein said tungsten layer is deposited by chemical vapor deposition at a temperature of between about 400° to 500° C. to a thickness of between about 3500 to 5000 Angstroms.

11. The method of claim 1 wherein said etching back of said tungsten layer uses $SF_6$, Ar, and He gases in a three step process wherein the first step is timed to etch away more than half of said tungsten thickness and wherein the second step uses same said gases and has an etching endpoint at said nucleation layer and wherein the third step uses the same said gases in a timed etch depending on said tungsten thickness.

12. The method of claim 1 wherein said etchback of said nucleation layer uses $Cl_2$ and Ar gases in a two step etching process wherein the first step has an etch rate of 2000 to 2500 Angstroms/minute and wherein the second step uses the same said gases at an etch rate of about 600 Angstroms/minute.

13. The method of claim 1 wherein said spin-on-glass layer is removed using buffered hydrofluoric acid for between about 30 to 120 seconds.

14. The method of completing electrical contacts in an integrated circuit using a disposable spin-on-glass layer comprising:

providing semiconductor device structures in and on a semiconductor substrate;

providing at least one patterned conductive layer for contacting the active elements of said device structures;

the surface of said patterned conductive layer structure is irregular with horizontal and vertical components;

depositing and flowing an insulator layer over said irregular structure patterned conductive layer;

covering said insulator with a spin-on-glass layer and baking said spin-on-glass layer;

defining contact openings through said insulator and spin-on-glass layers to said device structures and to said substrate;

depositing a nucleation layer over said spin-on-glass layer and within said contact openings;

depositing a layer of conductive metal over said nucleation layer;

etching back said conductive metal layer and said nucleation layer thereby leaving said conductive metal layer within said contact openings and leaving some of said conductive metal layer as residue overlying said spin-on-glass layer;

removing said spin-on-glass layer and thereby removing any said conductive metal layer residue overlying said spin-on-glass layer; and depositing a layer of metal to complete said contacts to said device structures and to said silicon substrate.

15. The method of claim 14 wherein said insulator layer is composed of borophosphosilicate glass deposited to a thickness of between about 3000 to 6000 Angstroms and flowed at conditions 800° to 900° C. in a nitrogen, argon, or steam ambient for 1 to 2 hours.

16. The method of claim 14 wherein said spin-on-glass layer has a thickness of between about 500 to 3000 Angstroms and is of siloxane type.

17. The method of claim 14 wherein said spin-on-glass layer has a thickness of between about 500 to 3000 Angstroms and is of silicate type.

18. The method of claim 14 wherein said spin-on-glass layer is baked with conditions 80°-100°-150°-200°-250°-300° C. for a duration of 1 to 2 minutes for each stage.

19. The method of claim 14 wherein said nucleation layer is composed of Ti/TiN and has a thickness of between about 800 to 2000 Angstroms.

20. The method of claim 14 wherein said nucleation layer is composed of Ti/TiW and has a thickness of between about 800 to 2000 Angstroms.

21. The method of claim 14 wherein said nucleation layer is composed of Ti/TiWN and has a thickness of between about 800 to 2000 Angstroms.

22. The method of claim 14 wherein said nucleation layer is composed of TiN and has a thickness of between about 800 to 2000 Angstroms.

23. The method of claim 14 wherein said conductive metal layer is tungsten and is deposited by chemical vapor deposition at a temperature of between about 400° to 500° C. to a thickness of between about 3500 to 5000 Angstroms.

24. The method of claim 14 wherein said etching back of said conductive metal layer uses $SF_6$, Ar, and He gases in a three step process wherein the first step is timed to etch away more than half of said conductive metal layer thickness and wherein the second step uses the same said gases with an etching endpoint at said nucleation layer and wherein the third step uses the same said gases in a timed etch depending on said conductive metal layer thickness.

25. The method of claim 14 wherein said etchback of said nucleation layer uses $Cl_2$ and Ar gases in a two step etching process wherein the first step has an etch rate of 2000 to 2500 Angstroms/minute and wherein the second step uses the same said gases at an etch rate of about 600 Angstroms/minute.

* * * * *